United States Patent [19]

Ohmi et al.

[11] Patent Number: 4,977,855

[45] Date of Patent: Dec. 18, 1990

[54] APPARATUS FOR FORMING FILM WITH SURFACE REACTION

[75] Inventors: Tadahiro Ohmi, Sendai; Masaru Umeda, Tokyo, both of Japan

[73] Assignee: OHMI Tadahiro, Miyagi, Japan

[21] Appl. No.: 261,833

[22] PCT Filed: Jan. 28, 1988

[86] PCT No.: PCT/JP88/00066

§ 371 Date: Sep. 28, 1988

§ 102(e) Date: Sep. 28, 1988

[30] Foreign Application Priority Data

Jan. 29, 1987 [JP] Japan .................................. 62-19036

[51] Int. Cl.$^5$ .............................................. C23C 16/00
[52] U.S. Cl. .................................... 118/722; 118/725; 427/54.1; 427/255.2
[58] Field of Search ............... 118/715, 719, 722, 725; 427/54.1, 255.2

[56] References Cited

U.S. PATENT DOCUMENTS

| 3,603,284 | 9/1971 | Garnache | 118/730 |
| 3,805,736 | 4/1974 | Foehring et al. | 118/719 |
| 4,313,783 | 2/1982 | Davies et al. | 156/345 |
| 4,788,309 | 11/1988 | Laine et al. | 556/410 |

FOREIGN PATENT DOCUMENTS

| 131887 | 7/1978 | Fed. Rep. of Germany | 118/715 |
| 3635647 | 5/1987 | Fed. Rep. of Germany | . |
| 59-140368 | 8/1984 | Japan | . |
| 68349 | 4/1985 | Japan | 118/719 |
| 60-130126 | 11/1985 | Japan | . |
| 1210180 | 9/1986 | Japan | 427/54.1 |
| 1217576 | 9/1986 | Japan | 427/54.1 |
| 61-230326 | 10/1986 | Japan | 118/722 |
| 62-13573 | 1/1987 | Japan | 118/728 |
| 2136571 | 6/1987 | Japan | 427/54.1 |
| 62-4870 | 10/1987 | Japan | . |
| 2290873 | 12/1987 | Japan | 118/722 |
| 63-228718 | 9/1988 | Japan | 118/722 |
| 8503088 | 7/1985 | PCT Int'l Appl. | 118/715 |

OTHER PUBLICATIONS

Garnache, R. R. and K. W. Zyber, "Gas Injection System", IBM Technical Disclosure Bulletin, vol. 14, No. 9, (Feb. 1972), p. 2551.

Primary Examiner—Shrive Beck
Assistant Examiner—Terry J. Owens
Attorney, Agent, or Firm—Jeffers, Hoffman & Niewyk

[57] ABSTRACT

An apparatus for forming a high quality film at high speed includes a wafer susceptor provided wiht a vacuum exhaust system, a stock gas supply system, and a heating mechanism for directly heating the susceptor. A ceramic filter means is disposed in opposite juxtaposed face to face position relative to the wafer susceptor for blowing stock gas in a uniform manner against a wafer. Means for activating the stock gas is provided to thereby increase the probability of adsorption of the stock gas on the wafer surface.

5 Claims, 4 Drawing Sheets

APPARATUS FOR FORMING FILM WITH SURFACE REACTION

BACKGROUND OF THE INVENTION

The present invention relates to an apparatus for forming a high quality film at a high speed.

BACKGROUND ART

In fabrication processes of semiconductor ICs, for example, processes of formation of films such as metal films of Al, Al—Si, Al—Cu—Si, W, and Mo, etc., semiconductor thin films of polysilicon, etc., and insulating films of $SiO_2$ and $Si_3N_4$, etc., are repeated. Thereupon, qualities of those films reflect upon the yields of the resulting products directly, and a rate of the film formation controls the throughput of those products. For the formation for such films, a process of CVD (Chemical Vapor Deposition) is frequently utilized. Thereupon, a technique of hot wall reduced pressure CVD, which employs an electric oven for heating a wafer (substrate), is primarily utilized. On the other hand, a CVD process is usually employed too, in which a wafer is heated by making use of radiofrequency heating or lamp heating (radiation heating) to heat only the wafer but without heating a reaction pipe wall and a reaction chamber inner wall as much as possible for thereby preventing gas temperature from being raised and restraining a reaction in gas phase to the utmost.

However, those CVD techniques are all adapted to force stock gas such as $SiH_4$, $SiH_6$, $SiH_2Cl_2$, $NH_3$, $O_2$, and $WF_6$, etc., to flow through the whole reaction chamber, and can not prevent a process from being produced, in which process a violent reaction is caused in gas phase even with the rise of gas temperature suppressed as much as possible and allows the stock gas to change to fine particles of smaller diameters in the gas phase and pour on a wafer. This is the primary reason why those CVD techniques can not assure high performance thin films. Moreover, since the stock gas is forced to flow through the whole reaction chamber, it has an extremely reduced ratio of a fraction thereof used for film formation on the wafer surface to the other fractions, and results in great quantities of products deposited on a reaction chamber inner wall and a downstream exhaust system inner wall while increasing in the extreme burdens to dispose exhaust gas. Those deposits on the reaction chamber inner wall produce dust which in turn interrupts fabrication of LSIs (Large-Scale Integrated Circuit), and hence maintenance to eliminate those deposits on the reaction chamber inner wall of the CVD device is urgent in the field. Those deposits thus reduce operating efficiency of the device and cause the interior of the reaction chamber to be exposed to the atmosphere with every maintenance, whereby the cleanness of the reaction atmosphere is deteriorated in the process of film formation owing to contamination caused by the atmospheric components deposited on the reaction chamber inner wall with the result of prevention of formation of high performance films and bad reproducibility of film thickness and film quality.

In fact, the present status of arts is no match for realization of an automated fabrication line with uniform quality of products and high yield thereof.

The present invention, for solves the problems of prior art CVD devices for film formation, as illustrated in FIG. 1 (T. Ohmi, "Soft and clean Technologies for submicron LSI fabrication", Proc. 1986 SEMI symposium, pp. 1~21 1986~12). In the FIG. 1, the numerals indicate the following: 11-ultra-high vacuum reaction chamber, which is formed by coating a SUS 304L having a circumferential surface rendered to mirror finishing with TiN; 12-wafer (substrate) such as silicon; 13- wafer susceptor for placing the wafer thereon; 14-wafer heating unit, which is composed of fourty five plasma torches disposed therein concentrically in a multi-stage fashion in the atmosphere of low gas pressure of $N_2$ and Ar; 15- infrared lamp heating unit, which heats the wafer 12 from the side of its surface; 16- stock gas supply system for supplying stock gas such as $SiH_4$, $Si_2H_6$, $H_2+SiH_2Cl_2$, $WF_6+H_2$ and the like; 17- load locking chamber; 18- wafer carrying-in unit; 19,20- turbo-molecular pumps; 21- mechanical booster pump; 22- rotary pump; 23- gas injection nozzle for blowing stock gas onto the surface of the wafer; 24- stock gas flow stream; 25-vacuum gauge; 26,27- gate valves; 28,29- vacuum valves; 30- gate valve; 31- synthetic quartz window through which an ultraviolet light and infrared rays can be very effectively transmitted; 32- metal diaphragm valve. The tendency of the technology toward the fabrication of submicron-sized LSIs also requires a large diameter wafer. That is, uniform formation of such a submicron pattern on the large-diameter wafer requires extremely uniform surface thereof both for film formation and for etching. It is difficult for conventional batch processing, which simultaneously processes many sheets of wafers, to satisfy such a requirement. Accordingly, a sheeting apparatus is required for processing wafers one at a time. The film formation device illustrated in FIG. 1 is such a device adapted to process wafers one at a time. Practical devices of this type necessitate a throughput of 60 sheets of wafers per hour, i.e., a sheet of wafer per minute. The device thereupon takes several seconds for transporting a wafer through the chamber 20 to 25 seconds for setting conditions of wafer temperature and gas flows, and about 30 seconds for film formation. The thickness of thin films of all sorts for use in LSIs are within approximately 1 $\mu m$. A minimum speed of film formation of about 2 $\mu m$ per minute is needed. Moreover, film quality must be sufficiently excellent.

Conditions to form a good quality thin film at a high speed are as follows: (1) Such a thin film is formed only with a surface reaction without causing a gas phase reaction; (2) Any reaction product should immediately be removed from the wafer surface; (3) A surface reaction rate should be sufficiently high and stock gas should be satisfactorily supplied onto the wafer surface and the like. The film formation device shown in FIG. 1 is designed to satisfy such requirements. That is, a reaction chamber inner wall is formed by coating a SUS 304L surface, which is polished by using a composite electropolishing technique without being accompanied by any machined layer, with TiN by means of an ion plating process, for thereby extremely reducing released gas from the surface. The reaction chamber 11 is connected to a turbo-molecular pump 19 having exhaust capacity of 2000 l/sec through a gate valve 27, for evacuation therein to the order of about $10^{-10}$ Torr. A wafer is heated by fourty five plasma torches (atmospheric gases are $N_2+Ar$ of $10^2$ to $10^{-3}$ Torr) arranged concentrically in multi-stage configuration. By controlling currents conducted through those plasma torches (this heating unit can independently control the current conducted through the respective plasma torches one at_ a time), wafer temperature and wafer in-surface temperature distribution can be controlled (this wafer heating unit is the first to make it possible to electronically control the wafer in-surface temperature distribution). The wafer 12 is carried into the ultra-high vacuum reaction chamber 11 from the load locking chamber 17 with the aid of the wafer carrying unit 18 of electrostatic attraction type after opening the gate valve 26. After the wafer temperature reaches prescribed temperature with heating by the wafer heating unit 14 and the infrared lamp heating unit 15, a metal diaphragm valve 32 is opened to permit stock gas to be injected from an injection nozzle 23 onto the wafer surface. Since the speed of travel of the injected stock gas is usually set to several hundred millisec, the stock gas takes several m/sec or less to travel from the injection nozzle 23 to the wafer surface. Therefore the temperature of the stock gas in gas phase is scarcely raised and as a result a reaction thereof in gas phase is wholly prevented. The stock gas adsorbed on the wafer surface contributes to film formation through a surface reaction. Furthermore, the stock gas is blown off into the reaction chamber kept at a ultrahigh vacuum forming a jet stream to thereby permit gas pressure in the reaction chamber to be reduced, whereby reaction products are also made very likely to be exhausted.

In the film formation device shown in FIG. 1, when a polysilicon film is formed using $Si_2H_6$ as the stock gas with the susceptor temperature of from 370° C. to 650° C., it is obvious that the reaction chamber has scarcely any deposit thereon except on the wafer surface and the wafer susceptor surface as well as the synthetic quartz window 31 has no cloudiness. In addition, the quality of the resulting polysilicon thin film is very excellent, too. Thus, the purpose to improve the film quality is achieved, and any dust is prevented from being produced owing to deposited on the reaction chamber inner wall, which is the most undesirable defect in prior CVD devices. Furthermore, the maintenance, which was needed every day, can be overwhelmingly lengthened in its time interval. It is however also made clear that only 0.1% of $Si_2H_6$ or less supplied to the wafer surface contributes to the formation of the polysilicon film. The purpose of the film formation device shown in FIG. 1 is to permit the stock gas supplied to the wafer surface to contribute to the film formation up to substantially 100%. It is however not achieved in this device. That is, it is insufficient only with the arrangement shown in FIG. 1 to realize high speed film formation.

Hereafter, a film formation apparatus in the present invention shall be referred to as a film formation apparatus with surface reaction, which forms a film by blowing stock gas only upon a wafer surface placed in a ultrahigh vacuum as illustrated in FIG. 1, to permit stock gas molecules to be adsorbed on the wafer surface, and utilizing a surface reaction of those adsorbed gases.

In view of the drawbacks of the prior devices, it is an object of the present invention to provide a film formation apparatus with surface reaction capable of film formation at a high speed by permitting stock gas blown upon the wafer surface to be effectively adsorbed on the wafer surface for thereby permitting the stock gas to effectively contribute to the film formation.

SUMMARY OF THE INVENTION

A film formation apparatus with surface reaction of the present invention is characterized by including a wafer susceptor device composed of a vacuum exhaust system, a stock gas supply unit, heating mechanisms, ceramic filter means positioned oppositely to the wafer susceptor for blowing off stock gas against a wafer surface, and means for activating the stock gas to thereby assure higher probability of adsorption of the stock gas onto a wafer surface.

In order to assure a high quality thin film, the reaction atmosphere must be kept clean to the utmost. Namely, only gas molecules necessary for the surface reaction are required to be supplied to the wafer surface. Thereupon, a gas storage container (a gas cylinder and a bubbler, etc.; hereinafter referred generically to as a gas cylinder) is filled with stock gas, which is stored in the gas cylinder for a long time and employed. Accordingly, the stock gas must be highly pure in itself while the inner wall of the gas cylinder must be kept clean, too. In addition, stock gas is desired to be distributed stably in itself in the gas cylinder so as to prevent any contaminant from mixing into the stock gas owing to a reaction of the stock gas with the cylinder inner wall. Surface adsorption probability of stable gas molecules blown against the mirror-finished wafer surface heated to prescribed temperature is typically very low. Accordingly, for effective adsorption of the stock gas on the wafer surface, it is necessary before arrival of the stock gas at the wafer surface to activate the stock gas molecules by removing at least one atom from atoms constituting the stock gas molecule to permit the molecule to aid in chemical bonding, or ionizing it to a charged molecule.

The film formation apparatus with surface reaction according to the present invention arranged as described above enables a high quality thin film to be formed at a high speed by permitting stock gas blown against the wafer surface to effectively adsorb on the same for contributing to film formation with the aid of a surface reaction.

DESCRIPTION OF THE PREFERRED EMBODIMENT

Figure 1:
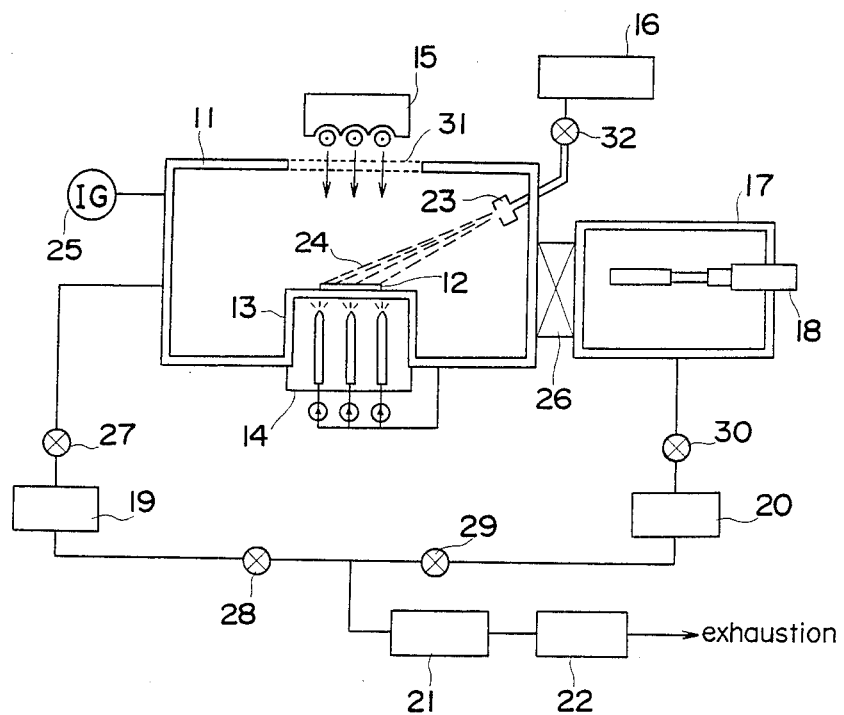
FIG. 1 is a schematic drawing illustrating a prior art film formation apparatus.

In what follows, an embodiment of a film formation apparatus with a surface reaction according to the present invention will be described with reference to the accompanying drawings.

DESCRIPTION OF THE PREFERRED EMBODIMENT

Prior to the description of the embodiment, the principles for a basic design of the apparatus at a high speed of the present invention will be described.

The number of molecules involved in gas supplied from a gas supply system is:

for a gas flow rate    the number of gas molecules 1 cc/min    = $2.69 \times 10^{19}$/min = $4.49 \times 10^{17}$/sec.

That is, the number of gas molecules involved in a gas stream with a flow rate of 1 cc/min is $2.69 \times 10^{19}$/min ($= 4.49 \times 10^{17}$/sec). The number of atoms involved in a thin film to be formed will be described briefly.

As an example, a typical Si single crystal thin film will be described. The number of atoms involved in a Si single crystal is $5 \times 10^{22}$/cm$^3$. Accordingly, the number of atoms per unit area involved in a 1 μm thick Si single crystal thin film is $5 \times 10^{18}$/cm$^2$. In the following, the amount of supply of stock gas and the rate of exhaustion of an exhaust pump will be estimated on the bases of the above-described evaluation, assuming that the stock gas is supplied substantially to 100% to contribute to film formation.

Processes of film formation of SiH$_4$ and Si$_2$H$_6$ are as follows:

$$SiH_4 = Si + 2H_2$$

$$Si_2H_6 = 2Si + 3H_2$$

One Si atom is produced from the SiH$_4$ molecule, while two Si atoms from Si$_2$H$_6$. The amount of gas supply for forming an 1 μm thick Si single crytal thin film per unit area of the wafer surface in 30 seconds is $(5 \times 10^{18} \times 2)/(2.69 \times 10^{19}) = 0.37$ cc/min.cm$^2$ for SiH$_4$ and 0.186 cc/min.cm$^2$ for Si$_2$H$_6$. Tables 1 and 2 list the amounts of supply gas for Si film formation with use of SiH$_4$ and Si$_2$H$_6$. The rate of film formation assumes a 1 μm-thick thin film to be produced in 30 seconds. It is a matter of course that a gas stream is blown against the wafer to slightly outside portions from wafer edges because it is difficult to form a uniform gas stream only just over the wafer surface, and hence gas flow rates somewhat higher than those listed in tables 1 and 2 are required.

The exhaust velocity of the exhaust system will now be evaluated. An exhaust velocity of H$_2$ gas twice as high as the flow rate of stock gas is required on the basis of the foregoing reaction process when the stock gas is SiH$_4$. With Si$_2$H$_6$, an exhaust velocity of H$_2$ gas 1.5 times the flow rate of stock gas is required.

Assuming here the flow rate of gas to be exhausted to be S (cc/min), an exhaust velocity of the exhaust system y (l/sec), and gas pressure in the reaction chamber P (Torr), $$y(l/sec) = S(cc/min)/79P(Torr).$$

the exhaust velocities for H$_2$ gas are respectively shown in tables 1 and 2 with the case of reaction chamber pressure P being $1 \times 10^{-3}$ Torr. Note here that in order to further completely release reaction products from the wafer surface the exhaust velocities listed in Tables 1 and 2 are usually presented for N$_2$ gas with the case of reaction chamber pressure P being $1 \times 10^{-3}$ Torr. Since exhaust capability of a pump for H$_2$ gas will be reduced to about one seventh or eighth, when the reaction product is H$_2$, exhaust capability of the turbo-molecular pump must be increased the more. In order to thus further thoroughly release reaction products from the wafer surface the mean free path of the H$_2$ molecule must be at least several cm and desirably several tens of cm. The reaction chamber pressure is desirably set to the order of $10^{-4}$ Torr. In order to reduce the pressure in the reaction chamber, the exhaust velocity of the exhaust system must be increased the more.

Figure 2:
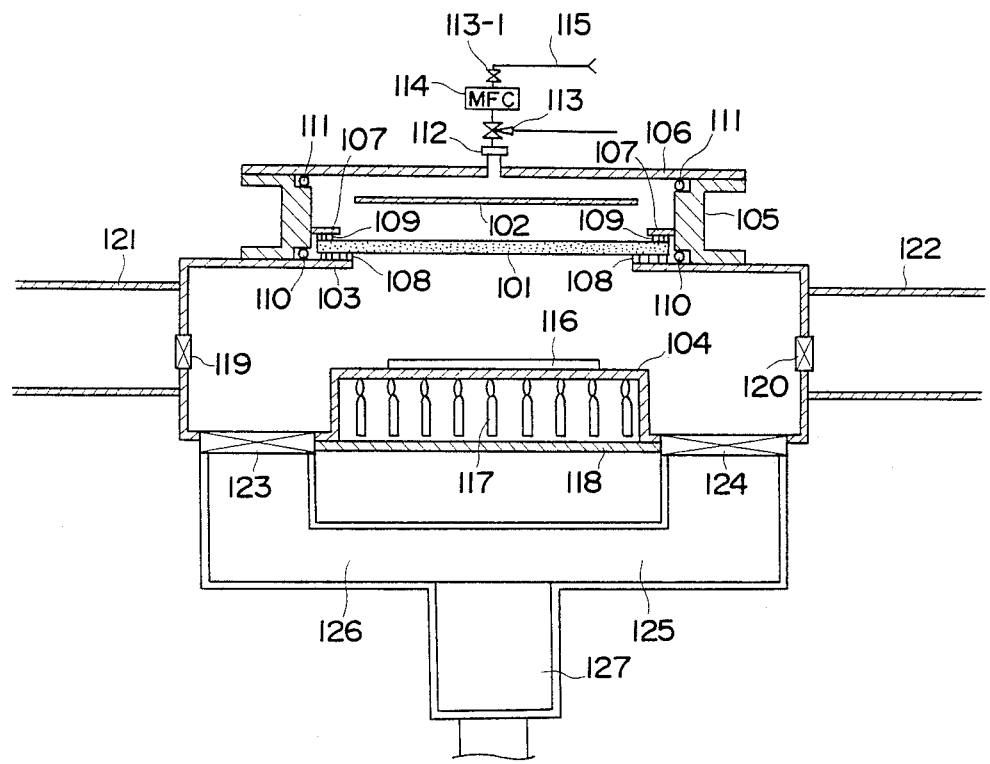
FIG. 2 is a schematic drawing illustrating an embodiment of a film formation apparatus with surface reaction according to the present invention.

FIG. 2 illustrates a cross section of the apparatus. 101 is a ceramic filter made of a material such as SiC and Al$_2$O$_3$, etc. . 102 is a turning blade facing on 101 for causing the vertical component of velocity of gas blown in a straight advancing direction to become zero in order to force the gas to flow uniformly from the ceramic filter to a wafer. 103 is a reaction chamber. 104 is a wafer susceptor for heating a wafer. Walls 105, 106 form a gas inlet plenum chamber. 107 are fixing jigs for fixedly mounting the ceramic filter. 108 and 109 are cushion materials yielded by coating Ni with polyimide resin. 110 and 111 are O rings for keeping airtightness. 112 is a joint such as a MCG (metal C ring) for connecting a gas supply system and a gas inlet plenum chamber. 113 is a double-throw three-way valve which is dead zone free. 113-1 is a metal diaphragm valve. 114 is a mass flow controller. 115 is a stock gas supply system. 116 is a semiconductor wafer. 117 are plasma torches arranged concentrically and cylindrically in multiple stages for heating a wafer (provided with a mechanism for electronically controlling a current flowing through a load. Electrical discharge is produced in the atmosphere of "N$_2$+Ar"). 118 are materials for the chamber wall of plasma torches for heating wafers. 119,120 are gate valves for carrying in and out a wafer (each having an opening slightly wider than a wafer size and thicker several times than a wafer thickness for assuring opening and closing thereof at a high speed). 121,122 are carrying chambers for loading or unloading wafers (provided with a vacuum exhaust system). 123,124 are gate valves of the reaction chamber main exhaust system, 125, 126 is an exhaust system. 127 is a vacuum pump for the turbo-molecular pump, etc.

Figure 3:
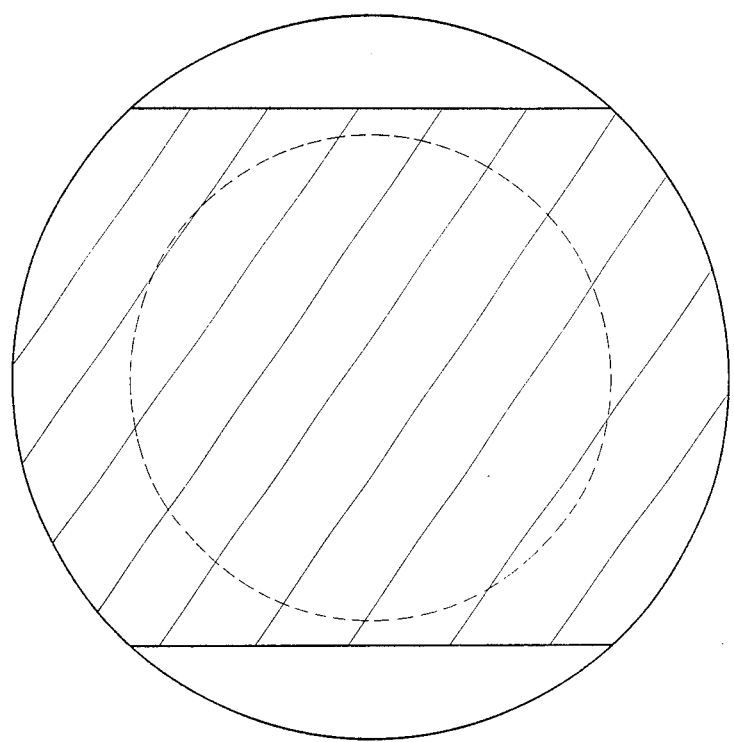
FIG. 3 is a schematic drawing illustrating a ceramic filter coated with a catalyst.

In the following, operation of the surface reaction film formation apparatus of the present invention will be described. Gas supply is interrupted by closing the valves 113, 113-1, and moving the turning blade 102 downward to bring it into close contact with the filter 101. Any residual gas in the reaction chamber 103 is exhausted therefrom to permit the interior of the chamber to be made a higher vacuum, and simultaneously the gate valve 119 is opened to permit a wafer 116, for which film formation processing has been completed, to be carried out to the wafer carrying chamber 121, while the gate valve 120 is opened to permit a new wafer to be carried onto the wafer susceptor 104 from the wafer carrying chamber 122. When the gate valves 119, 120 are closed and the wafer reaches prescribed temperature, the turning blade 102 is moved upward, and the valves 113, 113-1 are opened to permit stock gas to be blown at a prescribed flow rate against the wafer surface. The upward and downward motions of the turning blade 102 are controlled by employing drive parts of welded bellows mounted on three portions of the circumference of the turning blade 102 (separated by 120°) with the aid of chamber pressure and springs for example. Motor drive may also be possible. In order to make the interior of reaction chamber a high vacuum as quickly as possible after closing the valves 113, 113-1 and the turning blade 102, exhaust capacity of the main exhaust system 127 is desired to be as large as possible. Moreover, since the concerning gas is intermittently forced to flow, it is desired to employ a powerful vacuum pump endurable against a gas load. There are three types of gas activation means for increasing probability of adsorption of stock gas on the wafer surface as follows:

For the ceramic filter 101, one having a pore size ranging from 4~5 μm to several ten of μm is employed as the occasion calls for. As the pore size is decreased, the pressure difference across the filter is increased with a result of higher wind velocity as the concerning gas is blown off. Although depending on the pore size of the ceramic filter, the ceramic filter is coated with a catalyst such as platinum on the side of a blowing-off portion thereof to the thickness of from several thousands of Å to several μm, i.e., from about ten times to one hundred times of the pore size. The stock gas, which is brought into contact with the catalyst, forms a bonding and capable of effectively contributing to the surface adsorption because of part of the constituent element being separated. That is, the stock gas is, in case of $Si_2H_6$, decomposed to $SiH_3$ and $Si_2H_5$. The thickness of the coated catalyst is selected to be sufficient to effectively decompose the stock gas and unlikely to cause any reaction in gas phases. FIG. 3 illustrates how to coat a wafer with such a catalyst. Namely, a zonal oblique line portion extending left and right of the wafer is coated with a catalyst to predetermined thickness. The inside of a central circle drawn by a chain line is a filter with its outer periphery impermeable to gases. Right and left ends of the outer peripheral catalyst are usually made thicker in coating compared with the other portions thereof. This is to conduct a current in that direction and thereby control the temperature of a fraction of the catalyst through which the concerning gas passes by making use of the Joule effect. In case of an insulating filter such as an $Al_2O_3$ filter, current must be conducted through the catalyst as described above, whereas in case where a filter element is conductive in itself as in a SiC filter, it is desirous to raise the temperature of the filter to a predetermined one.

Figure 4:
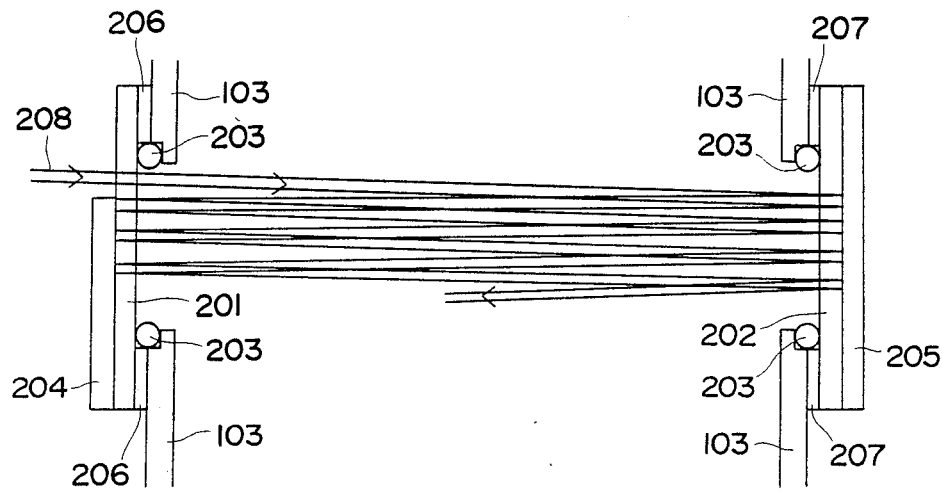
FIG. 4 is a schematic drawing illustrating an ultraviolet light excitation device for gas.

It is also effective for activation of the concerned gas to decompose and excite gas molecules by irradiating a stream of the gas blown off from the ceramic filter to the wafer with a flat plate-shaped excitation light. Thereupon, synthetic quartz windows are provided perpendicularly to curved surface of the reaction chamber of FIG. 2, and a flat plate-shaped ultraviolet beam of light is reflected therebetween multiple times. FIG. 4 illustrates its embodiment.

That is, synthetic quartz windows 201, 202, capable of transmitting ultraviolet light of 1700 Å, provided substantially perpendicularly to the direction of carrying the wafer in a confronting relation on the reaction chamber 103. Designated at 203 are O rings for keeping airtightness between the synthetic quartz plate and the reaction chamber 103, and 206 and 207 are resilient packing members such as TEFLON for also keeping air tightness between the synthetic quartz plate and the reaction chamber and affording mechanical strength to the apparatus. Likewise, designated at 204 and 205 are ultraviolet reflecting plates coated with MgF+Al for example on the internal surfaces thereof. Designated at 208 is a flat plate-shaped incident ultraviolet excitation light. An exciter laser is employed as an optical source, which emits ultraviolet light with a prescribed wavelength. The light emitting part includes cylindrical lenses arranged into multiple stages to form the flat plate-shaped excitation light with a prescribed thickness (about 2 to 10 mm for example). Although in FIG. 4 the excitation light is adapted to travel in one direction as an example, provided the synthetic quartz window and the reflecting plate are constructed to be a two-dimensional concave-shaped reflecting system, the excitation light can be confined in the optical system to improve the efficiency of the activation of the gas molecule.

Prior CVD film formation apparatuses were impossible to effectively employ such an optical excitation technique. The reason is that thick deposits are accumulated on the internal surface of the synthetic quartz window, through which ultraviolet light cannot naturally transmit very effectively, to thereby prevent the ultraviolet light from transmitting therethrough. According to the surface reaction film formation apparatus of the present invention, any stock gas is blown only against the wafer surface (including a very small area therearound) for film formation without substantially producing any cloudiness on the synthetic quartz window. Accordingly, such a multiple reflection optical excitation system can effectively be utilized. In the gas molecule excitation system of the type of confining a light with use of the two-dimensional concave-shaped reflecting plate, it is important to reduce the attenuation of a ultraviolet light inside the synthetic quartz plate as much as possible. Furthermore, it is desirous to raise the purity of the synthetic quartz and reduce the thickness thereof as much as possible. For example, surfaces of aluminum and stainless can be finished to 100 Å or less in flatness thereof by making use of a technique of composite electrolytic polishing (Hidehiko Maehata, Hiroshi Kamata, and Yoshiyasu Baba, "A Technique of Mirror polishing for Metal Surface by Composite Electrolytic Process And Cleaning of High Purity Gas Supply System", and "Ultrahigh Purity Gas Supply System, Chapter 10, pp. 332 to 369", under the supervision of Tadahiro Ohmi and Yukyu Nitta, edited by the Society for the Research of Semiconductor Substrate Technology, published by Riaraizu Company, 1986). For example, for aluminum, a surface thereof may be coated with MgF and $SiO_2$ in succession, and for stainless a surface thereof is first coated with Al by bias-sputtering and the like and in succession with MgF and $SiO_2$. Since the thicknesses of such coatings of MgF and $SiO_2$ range from about several thousands of Å to several μm, attenuation of a ultraviolet light is negligibly small when it transmits through the inside of those coatings. When a perfectly flat aluminum surface is used to reflect a light, it may be coated with a combination of $SiO_2$, $MgF_2$, and CaF, etc., respectively having different dielectric constants as a multilayer film for improving a coefficient of reflection.

When an electroconductive material such as SiC is used for the ceramic filter, it is also effective to excite stock gas to a plasma state by insulating the ceramic filter in high frequency and applying a radio frequency wave of from 100 to 200 $MH_z$ to the reaction chamber.

Although the film formation apparatus shown in FIG. 2 was arranged to mount a wafer upward, the wafer is required. Considering any dust or the like adheres to the wafer, to be mounted sustantially vertically or with its bottom up. For this, mechanical retaining means is usually employed, but it is not suited to the sheeting process because of the load locking mechanism becoming complicated. Thereupon insufficient attraction of a wafer to the water susceptor results in unsatisfactory temperature control for the wafer. In addition, in order to control the atmosphere within the reaction chamber in a very short time, the interior of the reaction chamber is desirous to be simple in its construction as much as possible. A wafer susceptor of electrostatic attraction type devised by the present inventor (Tadahiro Ohmi, "Wafer susceptor device", Japanese Patent Appleecation No. 60-265912) assures a simple structure, sufficient attraction of a wafer to the wafer succeptor, and precise temperature control for the wafer. Moreover, such a wafer susceptor device can control the electric potential of a wafer to an arbitrary value. Thus when an electrically conductive material is disposed on a water surface the surface can be controlled to arbitrary potential. Furthermore, stock gas molecules blown against the wafer surface are polarized by the effect of electrolysis produced in the wafer surface to thereby improve the absorption probability of those stock gas molecules on the wafer surface.

THE POSSIBILITY FOR USE IN INDUSTRIES

According to the film formation apparatus of the present invention, stock gas blown against the wafer surface substantially perpendicularly thereto through the ceramic filter is activated to improve the adsorption efficiency of the stock gas on the water surface for thereby assuring the formation of a thin film at a sufficiently high speed with reduced stock gas. Since there is scarcely produced any deposit on the internal wall of the reaction chamber excepting on the wafer, a period of maintenance is greatly prolonged together with the operating efficiency increased overwhelmingly, the atmosphere in the reaction chamber made extremely clean, and a high quality thin film formed at a high speed with good reproducibility. Furthermore, the burden of disposing of exhaust gas is sharply reduced.

| Amount of gas supply and exhaust velocity for formation of Si film using SiH4 (film formation rate = 1 μm/30 sec) | | | |
|---|---|---|---|
| wafer size | wafer area | SiH4 flow rate | H2 exhaust velocity |
| 4″ | 78.5 cm² | 29.1 cc/min | 73.6 l/sec |
| 5″ | 122.6 cm² | 45.5 cc/min | 115 l/sec |
| 6″ | 176.6 cm² | 65.5 cc/min | 166 l/sec |
| 8″ | 314 cm² | 116.5 cc/min | 295 l/sec |
| 10″ | 490.6 cm² | 182.0 cc/min | 461 l/sec |

TABLE 2

| Amount of gas supply and exhaust velocity for formation of Si film using Si2H6 (film formation rate = 1 μm/30 sec) | | | |
|---|---|---|---|
| wafer size | wafer area | Si2H6 flow rate | H2 exhaust velocity |
| 4″ | 78.5 cm² | 14.6 cc/min | 55.4 l/sec |
| 5″ | 122.6 cm² | 22.8 cc/min | 86.6 l/sec |
| 6″ | 176.6 cm² | 32.8 cc/min | 125 l/sec |
| 8″ | 314 cm² | 58.4 cc/min | 222 l/sec |

TABLE 2-continued

| Amount of gas supply and exhaust velocity for formation of Si film using Si2H6 (film formation rate = 1 μm/30 sec) | | | |
|---|---|---|---|
| wafer size | wafer area | Si2H6 flow rate | H2 exhaust velocity |
| 10″ | 490.6 cm² | 91.3 cc/min | 347 l/sec |

We claim:

1. An apparatus for film formation with surface reaction comprising: a reaction chamber, a wafer susceptor in said chamber for supporting a wafer, a vacuum exhaust system for exhausting said chamber, a stock gas supply for supplying stock gas to said chamber, and heating means for directly heating said susceptor, ceramic filter means positioned opposite said wafer susceptor in juxtaposed relation thereto for blowing stock gas uniformly upon a wafer being supported on said wafer susceptor without back diffusion of stock gas from said chamber through said ceramic filter, and means for activating said stock gas operatively associated with said chamber to thereby assure a higher probability of adsorption of said stock gas on the surface of a wafer whereby stock gas is used efficiently by said apparatus and stock gas products are prevented from building up on the inner walls of said reaction chamber.

2. A film formation apparatus according to claim 1 wherein said means for activating said stock gas comprises a multiple reflection source of ultraviolet light disposed between said ceramic filter means and said wafer susceptor.

3. An apparatus for film formation with surface reaction comprising; a reaction chamber, a wafer susceptor in said chamber for supporting a wafer, a vacuum exhaust system for exhausting said chamber, a stock gas supply for supplying stock gas to said chamber, and heating means for directly heating said susceptor, ceramic filter means positioned opposite said wafer susceptor in juxtaposed relation thereto for blowing stock gas upon a wafer being supported on said wafer susceptor, and a catalyst coating for at least a portion of said ceramic filter means to thereby assure a higher probability of adsorption of said stock gas on the surface of a wafer.

4. A film formation apparatus according to claim 1 wherein said ceramic filter has a larger area than the area of said wafer susceptor.

5. An apparatus for film formation with surface reaction comprising; a reaction chamber, a wafer susceptor in said chamber for supporting a wafer, a vacuum exhaust system for exhausting said chamber, a stock gas supply for supplying stock gas to said chamber, and heating means for directly heating said susceptor, ceramic filter means positioned opposite said wafer susceptor in juxtaposed relation thereto for blowing stock gas upon a wafer being supported on said wafer susceptor, a multiple reflection source of ultraviolet light disposed between said ceramic filter means and said wafer susceptor, and a catalyst coating for at least a part of said ceramic filter means to thereby assure a higher probability of adsorption of said stock gas on the surface of a wafer.

* * * * *